(12) United States Patent
Ullermann et al.

(10) Patent No.: US 10,070,514 B2
(45) Date of Patent: Sep. 4, 2018

(54) HIGH CURRENT SWITCH

(71) Applicant: Ellenberger & Poensgen GmbH, Altdorf (DE)

(72) Inventors: Wolfgang Ullermann, Schwabach (DE); Peter Meckler, Pommelsbrunn (DE); Manuel Engewald, Nuremberg (DE); Matthias Schwarz, Burgthann (DE); Ewald Schneider, Offenhausen (DE); Markus Miklis, Pfeifferhuette (DE)

(73) Assignee: ELLENBERGER & POENSGEN GMBH, Altdorf (DE)

( * ) Notice: Subject to any disclaimer, the term of this patent is extended or adjusted under 35 U.S.C. 154(b) by 0 days.

(21) Appl. No.: 15/339,037

(22) Filed: Oct. 31, 2016

(65) Prior Publication Data

US 2017/0048971 A1    Feb. 16, 2017

Related U.S. Application Data

(63) Continuation of application No. PCT/EP2015/000728, filed on Apr. 4, 2015.

(30) Foreign Application Priority Data

Apr. 30, 2014 (DE) .................. 10 2014 006 346

(51) Int. Cl.
*H05K 1/02* (2006.01)
*H01L 25/07* (2006.01)
(Continued)

(52) U.S. Cl.
CPC .......... *H05K 1/0263* (2013.01); *H01L 24/48* (2013.01); *H01L 25/072* (2013.01); *H02M 7/00* (2013.01); *F02N 11/087* (2013.01); *F02N 2011/0874* (2013.01); *H01L 2224/48137* (2013.01); *H01L 2224/48139* (2013.01); *H01L 2924/13091* (2013.01); *H05K 3/3421* (2013.01);
(Continued)

(58) Field of Classification Search
CPC ................. H05K 1/0265; H05K 3/341; H05K 2201/10272; H01L 2224/4811; H01L 2224/4813
See application file for complete search history.

(56) References Cited

U.S. PATENT DOCUMENTS 5,065,283 A    11/1991 Adachi et al.
5,132,896 A    7/1992 Nishizawa et al.
(Continued)

FOREIGN PATENT DOCUMENTS

DE    41 10 339 A1    10/1991
DE    693 31 676 T2    11/2002
(Continued)

*Primary Examiner* — Hoa C Nguyen
(74) *Attorney, Agent, or Firm* — Muncy, Geissler, Olds & Lowe, P.C.

(57) ABSTRACT

A high current switch, in particular for a motor vehicle, having a first bus bar, a second bus bar in addition to a first semi-conductor switch that has a control connection and a first transmission connection as well as a second transmission connection. The first transmission connection is placed in direct contact with the first bus bar and the second transmission connection is placed in direct electric contact with the second bus bar.

11 Claims, 4 Drawing Sheets

(51) Int. Cl.
*H02M 7/00* (2006.01)
*H01L 23/00* (2006.01)
*F02N 11/08* (2006.01)
*H05K 3/34* (2006.01)

(52) U.S. Cl.
CPC ............... *H05K 2201/0382* (2013.01); *H05K 2201/09054* (2013.01); *H05K 2201/09063* (2013.01); *H05K 2201/10166* (2013.01); *H05K 2201/10272* (2013.01); *H05K 2201/10553* (2013.01)

(56) References Cited

U.S. PATENT DOCUMENTS

| | | |
|---|---|---|
| 5,442,142 A | 8/1995 | Hayashi |
| 6,395,999 B1 | 5/2002 | Ploix |
| 6,693,370 B2 | 2/2004 | Yamane et al. |
| 7,167,377 B2 | 1/2007 | Onizuka et al. |
| 8,724,325 B2 | 5/2014 | Schnetker et al. |
| 2003/0137813 A1* | 7/2003 | Onizuka ............ H05K 1/0263 361/777 |
| 2008/0054373 A1 | 3/2008 | Chen et al. |
| 2010/0296254 A1* | 11/2010 | Schnetker ............ H01L 23/367 361/712 |

FOREIGN PATENT DOCUMENTS

| | | |
|---|---|---|
| DE | 102 54 910 A1 | 7/2003 |
| DE | 601 20 813 T2 | 2/2007 |
| DE | 10 2013 107 239 B3 | 3/2014 |
| EP | 0 590 643 B1 | 4/1994 |
| EP | 2 043 412 A1 | 4/2009 |
| EP | 2 254 152 A2 | 11/2010 |

\* cited by examiner

HIGH CURRENT SWITCH

This nonprovisional application is a continuation of International Application No. PCT/EP2015/000728, which was filed on Apr. 4, 2015, and which claims priority to German Patent Application No. 10 2014 006 346.1, which was filed in Germany on Apr. 30, 2014, and which are both herein incorporated by reference.

BACKGROUND OF THE INVENTION

Field of the Invention

The invention relates to a high current switch. A high current switch is can be a controllable switch for transferring and switching of electrical currents with an amperage between, for example, 50 A and 300 A. The high current switch can be used in the automotive field, for example, inside a utility vehicle.

Description of the Background Art

Utility vehicles, e.g. refrigerated trucks, have electrically powered auxiliary units, such as in particular a refrigerator or lifting platforms. Therefore, switching of the circuit supplying the respective unit is required for operation, which is usually accomplished by means of a high current switch. The electrical system of utility vehicles has an electrical voltage of 24V. To also power comparatively powerful auxiliary units, it is thus necessary to switch currents with a comparatively large current. Therefore, the high current switch usually includes a high current printed circuit board, having a base body with conductor interlayers with heavy copper technology with which power semiconductor switches are electrically contacted. The thickness of these copper layers is up to 400 μm. The costs for producing such base bodies are comparatively high.

From EP 0 590 643 B1, which corresponds to U.S. Pat. No. 5,442,142, a high current circuit board assembly is known which comprises a printed circuit board and a bus bar, which is spaced from the printed circuit board. By means of the bus bar, current is supplied to the circuit board fasteners.

SUMMARY OF THE INVENTION

It is therefore an object of the invention to provide a particularly suitable high current switch which is suitably inexpensive.

In an exemplary embodiment, a high current switch comprises a first bus bar and a second bus bar which in particular are structured identically. In other words, the first and the second bus bar do not differ. The first and the second bus bar form a connection of the high current switch to other components of a circuit. For this purpose, the bus bars at one end, for example, have connection terminals, openings, in particular bores, or the like. The bus bars are suitably self-supporting. In other words, the bus bars are designed comparatively massive and/or rigid. The bus bars are not part of a printed circuit board and are expediently not produced by means of etching or by the partial removal of a conductive layer, for example, a copper layer. Advantageously, the bus bars are created as a stamped and bent part from a sheet or are cut from a relatively massive sheet using laser cutting.

The bus bars are made of an electrically conductive material, for example, of copper or aluminum. Each of the bus bars is provided and designed to carry an electric current with a current of, for example, greater than 50 A, 100 A, 150 A, 200 A, 250 A and up to at least 300 A, 350 A, 400 A or 450 A, wherein the electrical voltage is suitably greater than or equal to 12 V, 24 V, 48 V, and expediently less than 60 V. The high current switch further comprises a first semiconductor switch, in particular a transistor. Suitably, the first semiconductor switch is a MOSFET or an IGBT. The first semiconductor switch has a first transmission connection, a second transmission connection and at least one control connection. By means of the control connection, the first semiconductor switch is controllable. By means of applying a relatively low electrical voltage, it is possible to convert the first semiconductor switch from a conducting state to a non-conducting state or vice versa. In other words, a comparatively low-impedance electrical connection between the first transmission connection and the second transmission connection can be made or canceled in this way. Consequently, by means of applying the electric voltage to the control connection, the electrical resistance between the first transmission connection and the second transmission connection is adjustable from a comparatively low resistance, in particular less than $0.1\Omega$, to a comparatively high electrical resistance, for example, 1 k$\Omega$. The first semiconductor switch is also expediently provided and adapted so that an electrical voltage of 12 V, 24 V or 48 V is applied at its transmission connections. The current carrying capacity of the first semiconductor switch, that is, the electric power maximally flowing from the first transmission connection to the second transmission connection, has, for example, a current of at least 10 A, 20 A, 30 A, 40 A, 50 A, 100 A, 150 A, 200 A or 250 A and suitably up to 300 A, 350 A, 400 A. In summary, the first semiconductor switch is in particular an electrical or electronic component which realizes the function of a switch as a semiconductor device. Suitably, the electric current for which the bus bars are designed is the same electric current for which the first semiconductor switch is designed, or at least an integral multiple thereof.

The first transmission connection of the first semiconductor switch is directly electrically contacted with the first bus bar, and the second transmission connection of the first semiconductor switch is directly electrically contacted with the second bus bar. In other words, the first semiconductor switch is connected in series to the first bus bar and the second bus bar, and the first bus bar is electrically contacted to the second bus bar by means of the first semiconductor switch. Direct electrical contact in this case can mean, for example, that the respective components substantially bear directly against one another, and that no further electrically conductive components are present between these components, irrespective of their individual electrical resistance. For this purpose, the components are, for example, soldered or welded. Specifically, the first transmission connection is welded to the first bus bar and the second transmission connection is welded to the second bus bar, or the respective components are soldered to one another.

The first semiconductor can be arranged spatially between the two bus bars so that the high current switch is substantially built up by layers. In summary, a current flow from the first bus bar to the second bus bar is adjustable by means of applying an electric voltage to the control connection of the first semiconductor, that is, a current flow is enabled or prevented.

Consequently, by means of the high current switch, an electric current can be switched. The electric current in this case has an electrical voltage of particular greater than 10 V and is, for example, equal to 12 V, 24 V, 48 V and expediently less than 60 V. The electric current is preferably greater than 10 A, 25 A, 50 A, 75 A, 100 A, 125 A, 175 A, 250 A, 300 A, 400 A or 500 A.

The high current switch can be a component of a motor vehicle, particularly a utility vehicle such as a truck, a bus or a construction vehicle. Alternatively, the motor vehicle can be an airplane, a boat, a yacht, a ship or an industrial vehicle such as a forklift. In other words, the high current switch is used for switching a circuit of such a vehicle. In particular, the high current switch is used to control the operation of a starter, or other such auxiliary unit, for example, of an air conditioner. Alternatively, the high current switch is used to operate a prime mover or as a main switch of a battery.

Due to the first semiconductor switch, no mechanical moving parts for operation of the high current switch are required, which could, for example, snag or fuse, or lose their functioning due to mechanical overload, for example, due to vibration. Because of the direct electrical contact of the first semiconductor switch to the bus bars, no circuit board is required, of which the current carrying capacity is equivalent to the current strength of the electric current switched by means of the high current switch. In particular, the high current switch has no circuit board with heavy copper technology. In other words, the high current switch is without heavy copper interlayers.

The first, preferably also the second bus bar, is independent of a possibly present circuit board. In this way, the cross section of the respective bus bar can be selected to be comparatively large, which during operation of the high current switch leads to a comparatively low heating of the electrical, current-carrying components. Accordingly, no active cooling of the high current switch is required, which reduces both the manufacturing cost and the operating costs. Appropriately, the high current switch is free of active cooling. For example, passive cooling elements are connected to the first semiconductor switch, which is thermally coupled to the passive cooling element.

The high current switch can have at least one further semiconductor switch, which is connected in parallel to the first semiconductor. In other words, the further semiconductor switch is also electrically contacted with the first and the second bus bar. In particular, the further semiconductor switch also has a first and a second transmission connection and a control connection, wherein said first transmission connection of the further semiconductor switch is suitably directly electrically contacted with the first bus bar, and the second transmission connection is suitably directly electrically contacted with the second bus bar. Advantageously, the transmission connections are soldered to the respective bus bar. In particular, the control connection of the further semiconductor switch is electrically connected to the control connection of the first semiconductor switch, and in particular, the two control connections are short-circuited. In this manner, upon application of an electrical voltage to the control connection of the first semiconductor switch, both semiconductor switches of the high current switch are always either in the conductive or in the non-conductive state. In particular, the further semiconductor switch is identical to the first semiconductor switch, which reduces storage time in production and favors current distribution.

Due to the parallel connection, the current guided by means of the first semiconductor switch is reduced so that the first semiconductor switch can be made smaller. In this way, the manufacturing costs and the size of the high current switch are reduced. Suitably, the high current switch includes a number of further semiconductor switches which are parallel to each other and are connected in parallel with the first semiconductor switch. In particular, the number of the further semiconductor switches is between four and nine, so that the number of semiconductor switches of the high current switch is between five and ten. Preferably, all further semiconductor switches which are connected in parallel to the first semiconductor switch are also directly electrically contacted with the respective bus bar.

For example, the bus bar is a stamped and bent part, which is cuboid or at least has a block-shaped portion which is referred to below as a supporting body. The bus bar is expediently designed in one piece, so that other components, if present, are formed on the respective supporting body. In particular, the first semiconductor is in this case electrically contacted directly with the cuboid supporting body or electrically contacted directly with a contact point integrally formed thereon, and is preferably in direct mechanical contact therewith. The cuboid shape hereby comprises in particular a width and a height which is in each case greater than 1 mm, and desirably, the length of the bus bar is greater than 10 mm, wherein during operation of the high current switch, the electric current in particular flows in the longitudinal direction, i.e., in a direction which is parallel to the length expansion. Suitably, the length is less than 20 cm, 15 cm, 10 cm, 5 cm and/or the width and/or height is less than 20 mm, 15 mm, 10 mm, 5 mm.

The cross section of the bus bar or the supporting body can be perpendicular to the flow direction of the electric current is greater than $1 \text{ mm}^2$, $2 \text{ mm}^2$, $5 \text{ mm}^2$, $10 \text{ mm}^2$, $100 \text{ mm}^2$ or $200 \text{ mm}^2$, and, for example, less than $3000 \text{ mm}^2$, $2000 \text{ mm}^2$ or $1000 \text{ mm}^2$. In this way, on the one hand, a relatively high current carrying capacity is realized, and on the other, relatively compact dimensions of the high current switch.

The bus bars can be made of copper, a copper alloy or aluminum. Suitably, the bus bars are nickel-plated, tin-plated or silver-plated. For example, the first semiconductor may be contacted on the free end of each bus bar therewith. If another semiconductor is present, the respective contact points are in this case spaced from this free end and preferably also from the remaining free end.

For example, the cross section of the bus bars between the two contact points, i.e., between the contact point of the first transmission connection of the further semiconductor switch and the contact point of the first transmission connection of the first semiconductor switch as well as between the corresponding contact points of the second bus bar, as compared to the other areas of the respective bus bar, is reduced. In particular, further semiconductor switches are provided and each bus bar has at one end a connection for a cable or a cable lug, wherein the cross section of the bus bars is reduced with increasing distance to the connection. For example, each bus bar is designed substantially step-shaped, wherein the point of contact is located at each step with one of the semiconductor switches. Alternatively, the bus bars are substantially configured in a triangular shape, a tip of the triangular shape being at the greatest distance to the connection. Due to the tapering cross section, less material is present for the manufacture of the bus bar, which leads to a savings in weight and cost. Because of the parallel connection of the semiconductor switches, the current is decreased in the region of the reduced cross section, so that even with a reduced cross section, no enhanced heating of the high current switch takes place during operation.

In an embodiment of the invention, each bus bar can be formed by a plate-shaped stamped and bent part, which is designed, for example, circular. The two plate-shaped stamped and bent parts are arranged parallel to each other and preferably spaced from one another such that the projections of the stamped and bent parts mutually overlap on planes parallel thereto. The thickness of the plates, that is, the extending direction perpendicular to the arrangement direction is, in particular, greater than 1 mm, 2 mm, 5 mm and advantageously smaller than 10 cm, 5 cm or 2 cm. Between the two stamped and bent parts, the first semiconductor switch is arranged. In particular, the first semiconductor switch is located between the two stamped and bent parts. Preferably, at least one further semiconductor switch and suitably, a number of semiconductor switches is present, which are also positioned between the two plates. In particular, the plates are circular and the semiconductor switches arranged concentric thereto, preferably in a star shape. Preferably, a connection, for example, in the shape of a cylinder, is integrally formed at the plates on the side situated opposite the first semiconductor switch. In particular, the cylinder has a number of grooves or clips for the attachment of an electrical cable. For example, an external thread is inserted into the circumferential surface of the cylinder. In this way, a relatively compact and robust high current switch is realized, wherein the semiconductor switches or the semiconductor switch are protected against possible damage by means of the bus bar.

In an embodiment of the invention, the first semiconductor switch and the further semiconductor switch or switches, if present, can be fixed to the first bus bar. Conveniently, the first semiconductor switch is also mounted on the second bus bar. If further semiconductor switches are present, these are in particular also mounted on the second bus bar. The explanations below with respect to the semiconductor switch or switches, with respect to the first bus bar, are also realized with respect to the second bus bar in a preferred embodiment of the invention.

The first semiconductor switch can be disposed between the first and the second bus bar, so that the interconnection of the first bus bar, the first semiconductor and the second bus bar layer is stacked in layers. In this way, the first semiconductor is comparatively safely secured against detachment from the bus bars. Alternatively, the first semiconductor and any other semiconductors are fixed to the bus bars in a sill-like manner. This allows for comparatively easy replacement in case of damage to the semiconductor or semiconductors. Due to the attachment of the first semiconductor on at least the first bus bars, no additional structural elements for determining the position of the first semiconductor and for the fixing thereof with respect to the first bus bar is required, which leads to reduced manufacturing costs. In particular, the attachment to the first bus bar takes place by means of the electrical contact, so that no additional work step is required, shortening the manufacturing time. In addition, due to the attachment to the first bus bar, the electrical contacting of the first semiconductor to the first bus bar is relatively lightly loaded, since no relative movement can occur between the two components due to different points of attachment. Further, a relatively compact high current switch is realized in this manner. Suitably, attachment is realized by means of soldering or welding.

In an embodiment of the invention, the control connection can be attached to a printed circuit board, which is preferably designed to be self-supporting. Conveniently, the printed circuit board has a conductive trace which is directly electrically contacted to the control connection of the first semiconductor. In this way, control of the first semiconductor switch is facilitated. In particular, the printed circuit board is fitted in a first step with electrical and/or electronic components, for example, using SMD technology. Here, the first semiconductor switch is also connected to the circuit board. In a further step, the first semiconductor switch is directly electrically contacted with the first and the second bus bar. In this way, it is possible to manufacture the printed circuit board independently of the bus bars, thereby shortening the manufacturing time. In addition, it allows for an independent inspection of the first semiconductor switch and its control electronics.

The first bus bar can have a point of contact that is in direct mechanical contact with the first transmission connection of the first semiconductor. Specifically, the first transmission connection is soldered or welded to the contact point. In this way, the position of the electrical contact between the first semiconductor and the bus bar is stabilized, so that even with a vibration of the high current switch, the electrical contact is not broken. For example, the first recess is greater than the contact point, so that between these a tolerance compensation is provided. Preferably, the contact point is aligned with the circuit board so that an essentially flat surface is created. Specifically, the first semiconductor switch is positioned along this surface, which facilitates assembly.

The first bus bar substantially can bear against the circuit board with its entire surface, resulting in a relatively stable position of the first bus bar. Alternatively, the first bus bar has the supporting body, which is spaced from the printed circuit board. In particular, the supporting body comprises a connection or a connection point for an electrical cable or electrical line. For example, this point is designed as an opening for fastening a cable lug by means of a threaded bolt. Due to the spacing, it is possible to manufacture the circuit board relatively compact. It is also possible to substantially equip the space provided entirely by the board with electrical and/or electronic components since an influence due to the electric current guided by means of the bus bar is substantially excluded. For example, the contact point is formed on the supporting body, if present. The contact point is, for example, designed L-shaped, wherein one of the branches bears against the printed circuit board. With the contact point, the first semiconductor switch is preferably directly electrically contacted. In this way, the electrical contact point is relatively close to the circuit board and therefore, relatively well protected.

The first bus bar and also the second bus bar can be fixed to the circuit board. The position of the first bus bar with respect to the first semiconductor switch can be stabilized by means of the circuit board, so that the electrical contact between the first transmission connection and the first bus bar will be charged comparatively low during operation of the high current switch and any possible vibration. For example, the first bus bar is soldered to the printed circuit board or bolted thereto. Alternatively, the bus bar has pin-like extensions or in particular, resiliently configured pins, which are frictionally and/or form-fittingly positioned in the corresponding openings of the circuit board. For assembly, the bus bar is positioned on the surface of the circuit board and pressed in a further step towards it until the extensions or pins are inserted in the respective openings to the desired extent. Particularly preferably, the projections are created by means of beading.

For example, the first bus bar can be positioned on the same side of the circuit board as the first semiconductor. In this way, a bearing surface for securing the printed circuit board is given by means of the remaining side of the circuit board, for example, within a housing. Also, an assembly of the first bus bar and the first semiconductor switch is simplified, and the overall height is relatively low. Alternatively, the circuit board is positioned substantially between the first semiconductor switch and the first bus bar. In this way, interference of any circuit located in particular on the side of the first semiconductor switch and contacted with the control connection is substantially excluded. For example, the second bus bar is positioned on the side of the circuit board on which the first bus bar is also disposed. Consequently, the attachment of the first and the second bus bar is provided in essentially one step. Alternatively, the circuit board is arranged between the first bus bar and the second bus bar. In this way, a short circuit or an electrical arc between the first and the second bus bar is prevented by means of the printed circuit board.

In an embodiment of the invention, the structure of the second bus bar can be substantially equal to the first bus bar. In other words, the second bus bar also, or alternatively, includes the contact point, which is arranged in a recess of the printed circuit board, and/or the second bus bar is secured on the printed circuit board by means of beads.

For example, the control connection can be electrically contacted with a conductive trace of a circuit board at which the first semiconductor switch is mounted. Alternatively, the circuit board is simply plugged onto the first semiconductor switch, or the conductive trace is part of a foil cable, which substantially does not fulfill a supporting function. In particular, such a foil cable or such a circuit board is arranged rotated substantially 90° to a plane, within which the first and the second bus bar are disposed. In an alternative embodiment of the invention, the control connection of the first semiconductor switch is directly electrically contacted with a cable, a wire or an electrical line. Advantageously, the line is soldered to the control connection of the first semiconductor switch. If other semiconductor switches are present, their respective control connection is expediently likewise directly electrically contacted with the same line. As a result, no circuit board is required to create the high current switch, which reduces cost. Replacement of the first semiconductor switch is also relatively easy, and furthermore, the space requirement for the high current switch is reduced.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
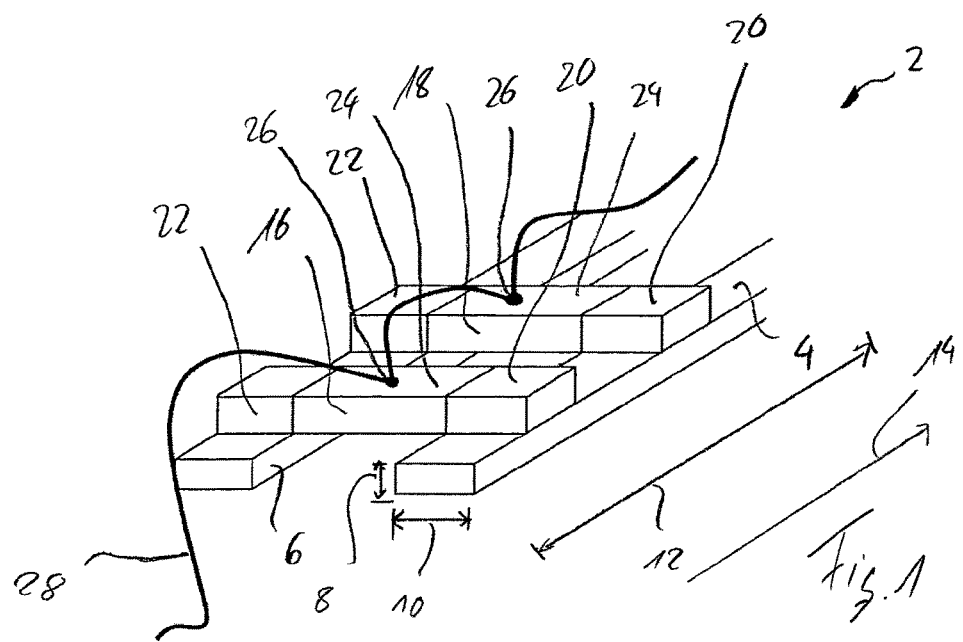
FIG. 1 in perspective, illustrates an embodiment of a high current switch, having cuboid bus bars, FIG. 2 in perspective, illustrates an embodiment of the high current switch, FIG. 3 in perspective, illustrates an embodiment of the high current switch, FIG. 4 in perspective, illustrates an embodiment of the high current switch, having cylindrical bus bars, FIG. 5 in perspective, illustrates a printed circuit board, FIG. 6 in a plan view, illustrates a first semiconductor switch which is contacted with an embodiment of the first bus bar, FIG. 7 in perspective, illustrates the first bus bar as shown in FIG. 6, and a second bus bar, FIG. 8 in perspective, illustrates an embodiment of the high current switch with the bus bars according to FIG. 7, and FIG. 9 in perspective, illustrates an embodiment of the high current switch with the bus bars according to FIG. 7.

FIG. 1 shows a first embodiment of a high current switch 2 in perspective. The high current switch 2 has a first bus bar 4 and a second bus bar 6, which are identical. In other words, the first bus bar 4 and the second bus bar 6 do not differ. The first bus bar 4 has a cuboid stamped and bent part of a tinned copper. The height 8, that is, the thickness of the first bus bar 4, is 3 mm, the width 10 is at least 3 mm, and the length 12, that is, the expansion of the first bus bar 4 along a longitudinal direction 14, is 50 mm. The first bus bar 4 and the second bus bar 6 are parallel to the longitudinal direction 14 and disposed spaced from one another in the direction of the width 10.

The high current switch 2 furthermore comprises a first semiconductor switch 16 and another semiconductor switch 18, which are each designed as a MOSFET and also identical. Thus, each semiconductor switch 16, 18 has a first transmission connection 20 and a second transmission connection 22 which are each designed cap or cup-like. In between, a center piece 24 made of a semiconductor material is arranged, respectively. The center piece 24 also has a control connection 26, by means of which the electrical conductivity of each semiconductor switch 16, 18 can be adjusted.

At each of the control connections 26, an electrical line 28 is soldered, thus, directly electrically contacted to the control connection 26. The electrical line 28 is electrically connected to an electronics, not illustrated, and is acted upon during operation of the high current switch 2 with a control signal that is an electric voltage. Each first transmission connection 20 of the two semiconductor switches 16, 18 is soldered to the first bus bar 4, wherein the two semiconductor switches 16, 18 are spaced apart from each other in the longitudinal direction 14. Along the width 10 of the bus bars 4, the first transmission connections 20 make full contact over the entire surface of the first bus bar 4. In the same manner, the second transmission connections 22 are attached to the second bus bar 6 and thus electrically contacted therewith. As a consequence of the arrangement, the two semiconductor switches 16, 18 are connected in parallel. The first semiconductor switch 16 is disposed at the free end of the first and the second bus bar 4, 6, that is, in an end portion in the longitudinal direction 14 of the two bus bars 4, 6.

The high current switch 2 is part of a vehicle electrical system of a motor vehicle, wherein by means of the high current switch 2, an air conditioning system is turned on or off. During operation of the high current switch 2, an electric voltage of 24 V is applied between the first bus bar 4 and the second bus bar 6. Provided that no electric voltage is applied at the electric line 28 by the not-shown electronics, both the first semiconductor switch 16 and the further semiconductor switch 18 are in a non-conductive state. In other words, no electric current flows from the first bus bar 4 to the second bus bar 6. When the electric line 28 is acted upon with an electrical voltage by means of the electronics, both the first semiconductor switch 16 and the further semiconductor switch 18 are transferred to the conductive state. As a result, an electric current with a current of 280 A flows from the first bus bar 4 through the semiconductor switch 16, 18 to the second bus bar 6, and the air conditioning system of the utility vehicle is in operation. Due to the parallel connection of the two semiconductor switches 16, 18, in this case, only a current with a current strength of substantially 140 A flows through each of the semiconductor switches 16, 18.

Figure 2:
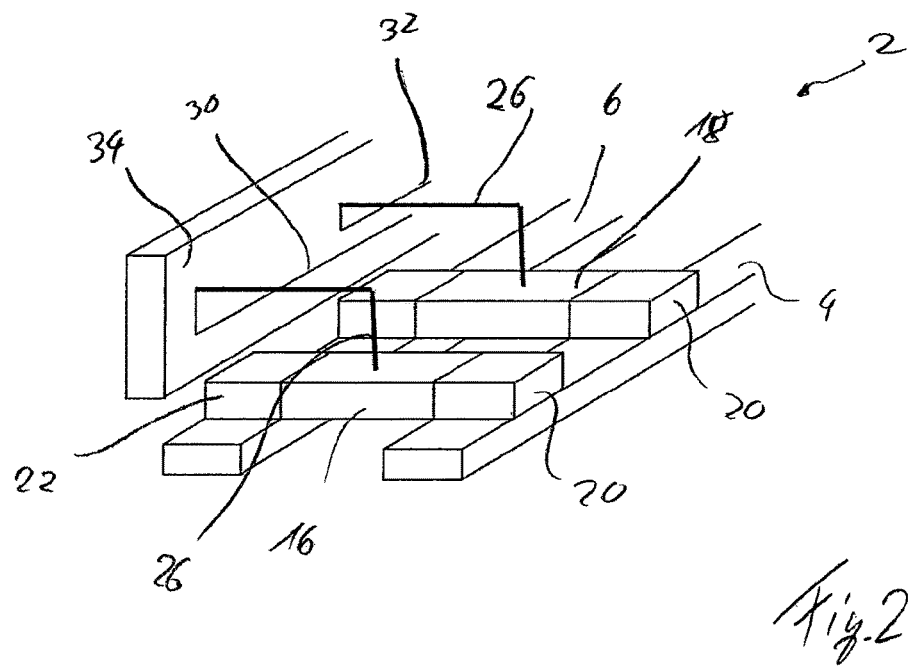

FIG. 2 illustrates a further embodiment of the high current switch 2, wherein the two bus bars 4, 6 correspond to those shown in the previous example. The semiconductor switches 16, 18 and their attachment and electrical contact with the two bus bars 4, 6 also correspond to those of the preceding embodiment. Only the control connection 26 is modified. Instead of running essentially at points, the control connection 26 is an L-shaped bent conductor. Here, the control connection 26 of the first semiconductor switch 16 is electrically contacted with a first conductive trace 30 and the control connection 26 of the further semiconductor switch 18 with a second conductive trace 32 of a printed circuit board 34. The first conductive trace 30 is electrically isolated from the second conductive trace 32 so that the two semiconductor switches 16, 18 can be controlled independently. In other words, it is possible to convert either the first semiconductor switch 16 or the second semiconductor switch 18 or both semiconductor switches 16, 18 into a conductive or a non-conductive state. The circuit board 34 is arranged at a distance to the two bus bars 4, 6, wherein the second bus bar 6 is located between the circuit board 34 and the first bus bar 4. Also, the orientation of the printed circuit board 34 is perpendicular to the plane within which the two bus bars 4, 6 are arranged. In this way, a relatively simple inspection of the individual components of the high current switch 2 is possible.

Figure 3:
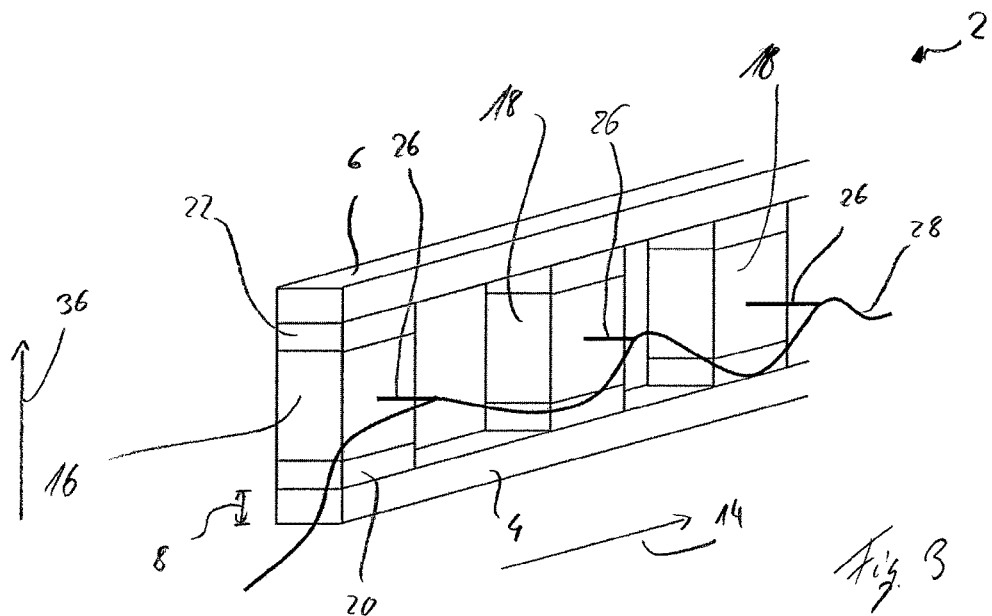

FIG. 3 also shows a further embodiment of the high current switch 2 in perspective. The configuration of the two bus bars 4, 6 as a stamped and bent part and their dimensions correspond to the ones already known. Only the material of which the two bus bars 4, 6 are made is modified to aluminum. Further, the positioning of the two bus bars 4, 6, parallel-aligned to one another in the longitudinal direction 14, is modified. The second bus bar 6 is offset parallel to the height 8 with respect to the first bus bar 4 in a first direction 36. In the first direction 36 between the first bus bar 4 and the second bus bar 6, the first semiconductor switch 16 and two other semiconductor switches 18 are positioned, wherein their respective cup-shaped transmission connections 20, 22 make contact with the entire surface of the respective pot base on the associated bus bar 4, 6. In a direction perpendicular to the first direction 36 and perpendicular to the longitudinal direction 14, the semiconductor switches 16, 18 are flush with the two bus bars 4, 6, and are welded to the respective bus bars 4, 6. With the exception of the design of the control connections 26, the semiconductor switches 16, 18 correspond to those shown in FIG. 2. The control connections 26 are in fact not formed L-shaped, but only realized by means of an unbent wire to which the electric line 28 is soldered. Due to the use of three semiconductor switches 16, 18, the electric current flowing through each of the semiconductor switches 16, 18 is reduced to a current of less than 100 A, which increases the service life of the semiconductor switches 16, 18 and reduces the thermal load as well as the heating of the environment of the high current switch 2.

Figure 4:
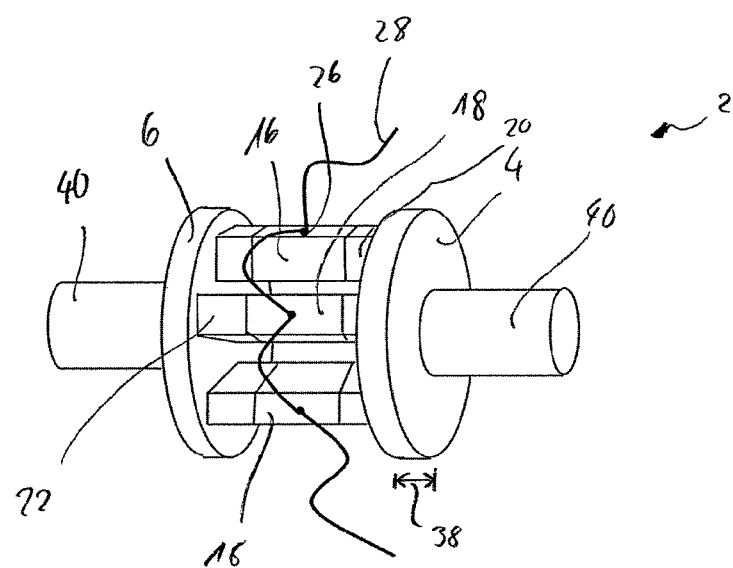

FIG. 4 shows a further embodiment of the high current switch 2. The high current switch 2 includes the first semiconductor switch 16 as well as two further semiconductor switches 18, which with the exception of the configuration of the control connection 26, correspond to the semiconductor switches 16, 18 shown in FIG. 3. The control connections 26 and the contact with the electric line 28 correspond to the embodiments shown in FIG. 1. The first bus bar 4 and the second bus bar 6 are in each case designed plate-like as a round disk and are produced by stamping from a sheet. The thickness 38 of the two identical bus bars 4, 6 is 2 mm. The two bus bars 4, 6 are arranged parallel to one another, wherein the semiconductor switches 16, 18 are positioned between the bus bars 4, 6. In the direction perpendicular to the plane of arrangement of the two bus bars 4, 6, the two bus bars 4, 6 overlap and are spaced apart from each other. Within the gap formed in this way, the semiconductor switches 16, 18 are positioned and are soldered with their respective transmission connections 20, 22 at the two bus bars 4, 6.

Here, the semiconductor switches 16, 18 are arranged star-shaped and rotationally symmetrical with respect to a straight line defined by the two center points of the circular bus bars 4, 6. On the side of the two bus bars 4, 6 disposed opposite the semiconductor switches 16, 18, a cylindrical connection 40 is concentrically formed to the respective bus bar 4, 6. Each connection 40 has a not-shown external thread for fastening. The connections 40 are made of the material of the bus bars 4, 6, so that an electric current can flow via one of the connections 40 to the first bus bar 4, from there via the parallel-connected semiconductor switches 16, 18 to the second bus bar 6, and then to the remaining connection 40, provided that the semiconductor switches 16, 18 are suitably controlled via the control connections 26.

Figure 5:
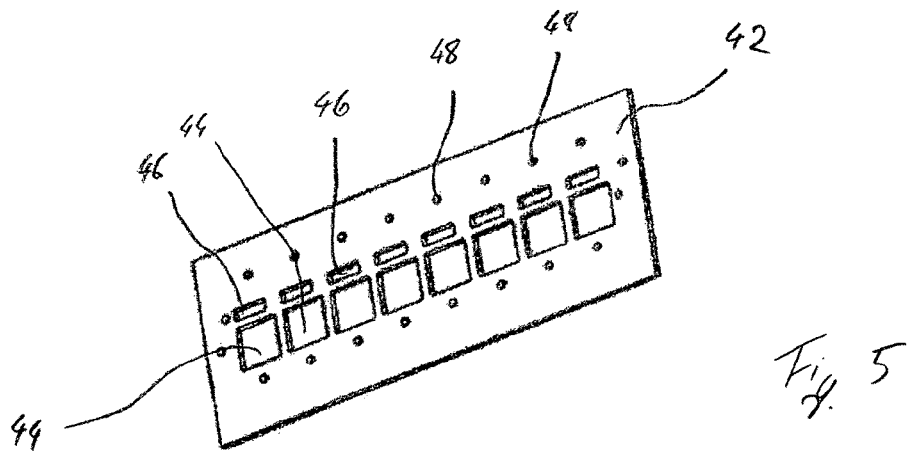

FIG. 5 illustrates a circuit board 42 in a further embodiment of the high current switch 2, with eight square-shaped second recesses 44, eight square-shaped first recesses 46, and a number of circular openings 48. By means of the openings 48, a rectangular shape is formed, within which the parallel-arranged second recesses 44 and the first recesses 46 are arranged. The recesses 44, 46 extend through the circuit board 42.

Figure 6:
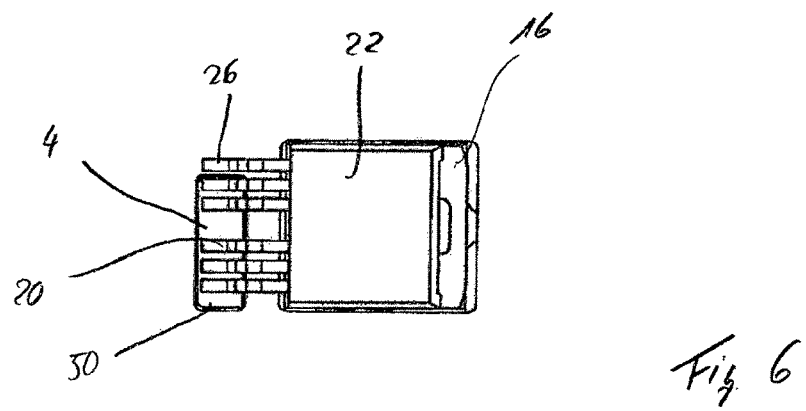
Figure 7:
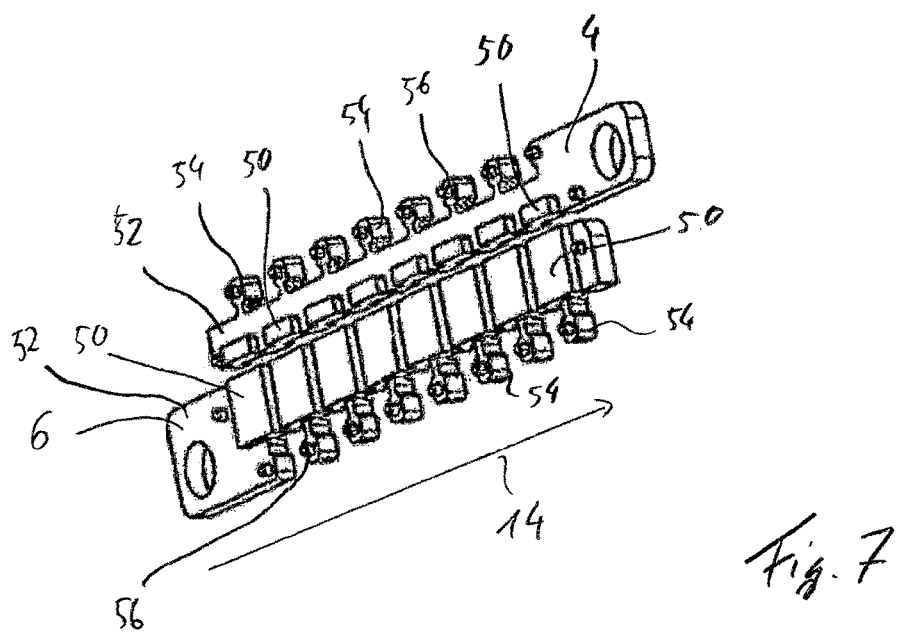
Figure 8:
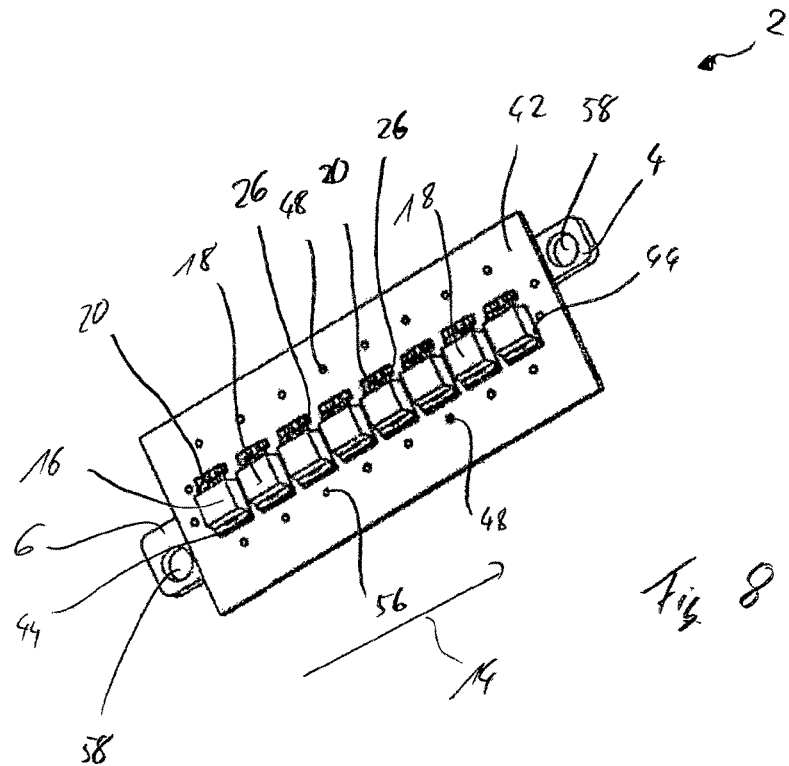

FIG. 6 shows the first semiconductor switch 16 and in part, the first bus bar 4 in a plan view. The first bus bar 4 in this case has eight rectangular contact points 50 which are integrally formed on a supporting body 52 (FIG. 7). At one of the contact points 50, the first transmission connection 20 of the first semiconductor switch 16 is soldered in the form of five pins. The control connection 26 also formed by means of a pin is electrically contacted with a conductive trace of the printed circuit board 42 in the assembled state (FIG. 8). The second transmission connection 22 of the first semiconductor switch 16 is created by means of a square connection plate, which dimensions are smaller than those of the second recess 44 of the circuit board 42.

FIG. 7 shows the first bus bar 4 as well as the second bus bar 6 as they correspond to the mounting position of the high current switch 2 shown in FIG. 8. Each of the bus bars 4, 6 includes the supporting body 52, which extends in the longitudinal direction 14. Here, eight cuboid contact points 50 are integrally formed on the supporting body 52 of the first bus bar 4, which respective dimensions correspond to the first recess 46. On the supporting body 52 of the second bus bar 6, eight contact points 50 are also formed, these being designed larger compared to those of the first bus bar 4. The dimensions of the contact points 50 of the second bus bar 6 are smaller than those of the second recesses 44. Further, seven extensions 54 are integrally formed with a thickened free end on each supporting body 52, which are directed away from the respective, other bus bar 4, 6. At each of the extensions 54, there is a bead 56.

FIG. 8 shows the high current switch 2 with the components shown in FIGS. 5-7. The high current switch 2 includes the first semiconductor switch 16 and seven other semiconductor switches 18, which are identical to the first semiconductor switches 16. Each semiconductor switch 16, 18 is applied to the printed circuit board 42 and is fixed thereto. Within the second recesses 44, the contact points 50 of the second bus bar 6 are positioned and soldered to the respective second transmission connection 22. Within the first recesses 46, the contact points 50 of the first bus bar 4 are disposed, at each of which the first transmission connection 20 of the semiconductor switches 16, 18 is soldered.

The circuit board 42 is located between the semiconductor switches 16, 18 and the supporting bodies 52 of the two bus bars 4, 6, which bear against the entire surface of the printed circuit board. Within the openings 48, the beads 56 of the bus bars 4, 6 are arranged non-positively and positively, so that the bus bars 4, 6 are attached to the printed circuit board 42. Each supporting body 52 comprises at one of the free ends a circular opening 58, within which a threaded bolt for fastening a cable lug is disposed partially in each case in the assembled state. Here, the two openings 58 are located on opposite ends in the longitudinal direction of the high current switch 2.

Figure 9:
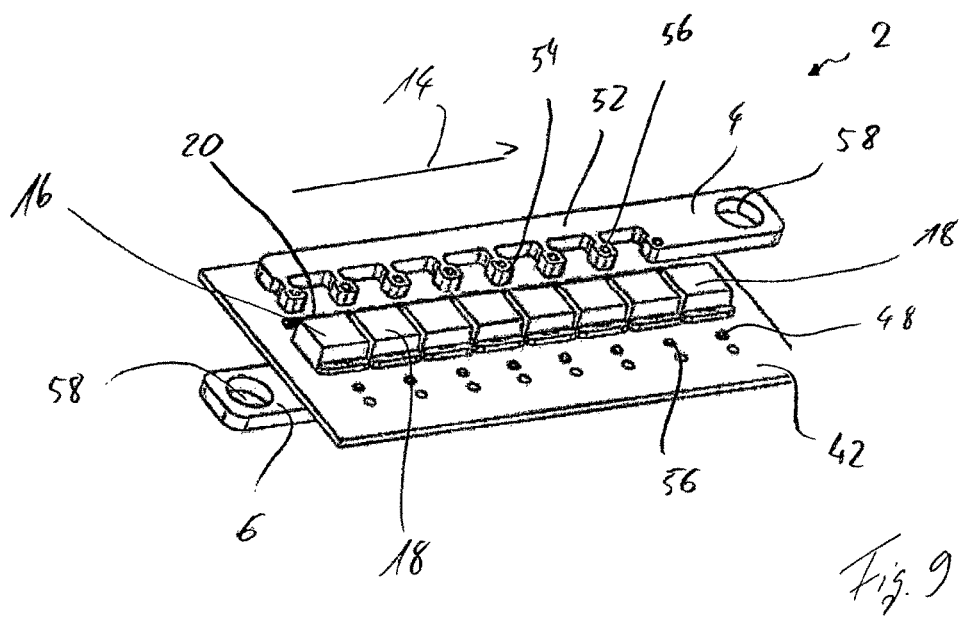

FIG. 9 shows a further embodiment of the high current switch 2 in perspective, which with the exception of the design of the first bus bar 4, corresponds to the embodiment shown in FIG. 8. This first bus bar 4 also includes the supporting body 52, which bears against the printed circuit board 42. The circuit board 42 is located, however, between the first bus bar 4 and the second bus bar 6, so that the supporting body 52 is positioned on the side of the semiconductor switches 16, 18. On the supporting body 52, the extensions 54 are also integrally formed with the beads 56, which protrude into the corresponding opening 48.

The invention is not limited to the embodiments described above. Rather, other variations of the invention to those skilled in the art can be derived therefrom without departing from the scope of the invention. In particular, further, all individual features described in relation to the individual embodiments can be combined in a different way with each other without departing from the scope of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A high current switch of a motor vehicle, comprising:
   a first bus bar;
   a second bus bar; and
   a first semiconductor switch with a control connection and a first transmission connection and a second transmission connection, the first transmission connection being directly electrically contacted with the first bus bar and the second transmission connection being directly electrically contacted with the second bus bar,
   wherein the first bus bar is arranged parallel to the second bus bar, such that a first face of the first bus bar opposes a first face of the second bus bar,
   wherein the first semiconductor switch is arranged between the first bus bar and the second bus bar,
   wherein an end face of the first transmission connection opposes the first face of the first bus bar and an end face of the second transmission connection opposes the first face of the second bus bar, and
   wherein the end face of the first transmission connection directly electrically contacts the first face of the first bus bar and the end face of the second transmission connection directly electrically contacts the first face of the second bus bar.

2. The high current switch according to claim 1, further comprising a second semiconductor switch that is connected in parallel to the first semiconductor switch.

3. The high current switch according to claim 1, wherein each bus bar is formed by a cuboid stamped and bent part that has a width greater than 1 mm, a height greater than 1 mm and a length greater than 10 mm.

4. The high current switch according to claim 1, wherein, each bus bar is formed by a plate-shaped stamped and bent part.

5. The high current switch according to claim 1, wherein the first semiconductor switch is attached to the first bus bar and to the second bus bar.

6. The high current switch according to claim 1, wherein the control connection is fixed to a printed circuit board and electrically contacted therewith.

7. The high current switch according to claim 6, wherein the first bus bar has a contact point with which the first transmission connection is in direct mechanical contact and which is arranged in a first recess of the printed circuit board.

8. The high current switch according to claim 7, wherein the contact point is flush with the printed circuit board.

9. The high current switch according to claim 6, wherein the printed circuit board is oriented perpendicular to the first bus bar and the second bus bar.

10. The high current switch according to claim 6, wherein the first bus bar and the second bus bar are fixed on the printed circuit board via beads.

11. The high current switch according to claim 1, wherein the control connection is directly electrically contacted with an electrical line.

* * * * *